United States Patent [19]

Honjo et al.

[11] Patent Number: 4,994,928
[45] Date of Patent: Feb. 19, 1991

[54] FREQUENCY DEMODULATION CIRCUIT

[75] Inventors: Masahiro Honjo, Neyagawa; Masaaki Kobayashi, Kawanishi, both of Japan

[73] Assignee: Matsushita Electric Industrial Co., Ltd., Osaka, Japan

[21] Appl. No.: 189,169

[22] Filed: May 2, 1988

[51] Int. Cl.$^5$ ............................................. G11B 20/06
[52] U.S. Cl. ...................................... 360/30; 360/33.1
[58] Field of Search .................... 360/30, 33; 329/126; 358/330

[56] References Cited

U.S. PATENT DOCUMENTS 4,470,080 9/1984 Kimura ................................. 360/30

FOREIGN PATENT DOCUMENTS 57-189311 11/1982 Japan .
2079076 6/1981 United Kingdom .

*Primary Examiner*—Vincent P. Canney
*Attorney, Agent, or Firm*—Wenderoth, Lind & Ponack

[57] ABSTRACT

A frequency demodulation circuit superposes pulses on an input frequency-modulated (FM) signal at substantially the peaks of the FM signal before demodulating the FM signal so that zero cross points of the FM signal can be correctly restored. A peak detection circuit detects peaks of the FM signal or peaks of the fundamental wave of the FM signal, which substantially correspond to the peaks of the FM signal. A pulse generating circuit generates, from the peak detection result, pulses respectively occurring at the same timings as those of the detected peak occurrance timings. The generated pulses are added to the FM signal to obtain the pulse-superposed FM signal.

17 Claims, 6 Drawing Sheets

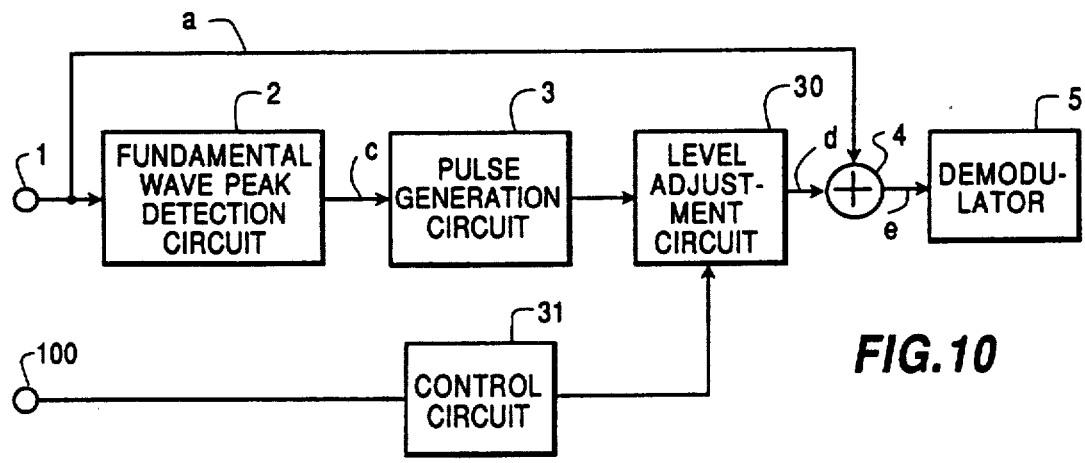
FIG.10
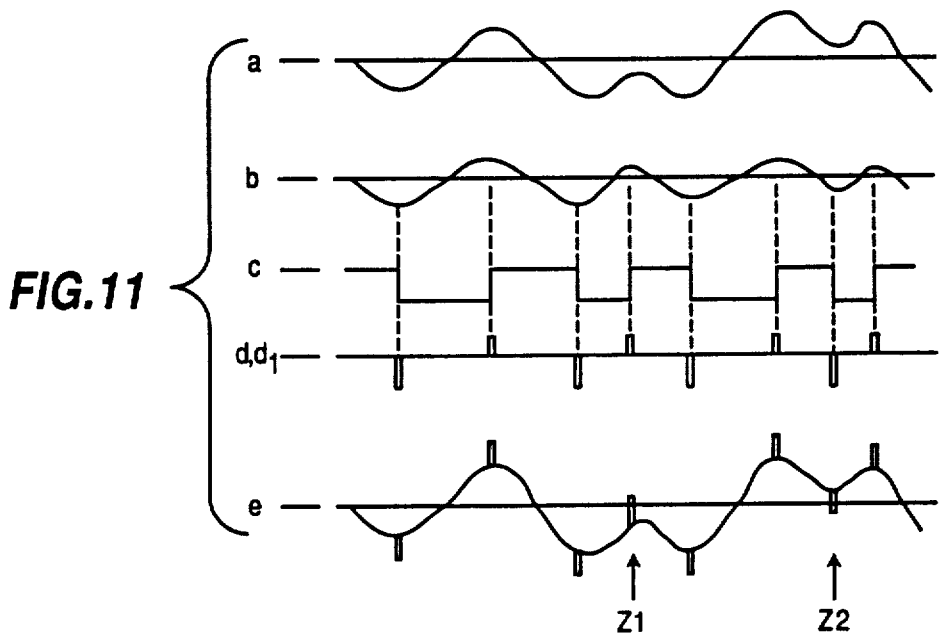
FIG.11
FIG.12
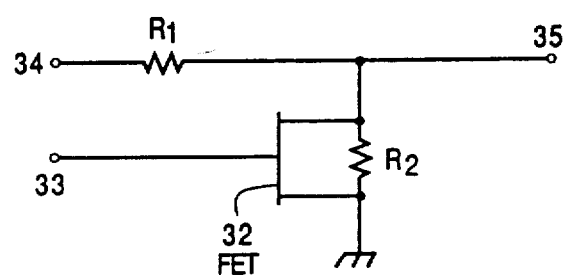

FREQUENCY DEMODULATION CIRCUIT

BACKGROUND OF THE INVENTION

1. Field of the Invention

This invention relates to a frequency demodulation circuit for demodulating a frequency-modulated (FM) signal.

2. Description of the Prior Art

In a magnetic recording and reproducing apparatus which perform low carrier FM recording and FM single side-band reproduction such as a commercial VTR, when the FM signal has a large frequency modulation index, a zero cross point often cannot be reproduced with fidelity in an FM demodulator, so that a signal inversion, or an inversion phenomenon is apt to occur. This phenomenon occurs when the level of lower sideband component $J_{-1}$ becomes greater than the level of the FM fundamental wave component $J_0$. Furthermore, when the reproduced noise is overlapped, the inversion phenomenon occurs due to the influence of the noise even when $J_{-1} < J_0$.

To avoid the occurrence of this inversion phenomenon, a frequency demodulator disclosed in U.S. Pat. No. 4,470,080 superposes pulses on an input FM signal before demodulating the FM signal. The superposed pulses occur at timings delayed by a specific time from the zero cross points of the fundamental wave component of the FM signal. The specific time is set such that the pulses are superposed on the peak points of the FM signal at the carrier frequency. This operation will be described in more detail with reference to the block diagram shown in FIG. 16 and the waveform diagram shown in FIG. 17.

The fundamental wave component i of an input FM signal h is output by a band-pass filter 20, and delayed by a prescribed time by a delay circuit 21 to form signal j. The signal j is passed through a limiter 22 to obtain a signal k, from which pulse signals l are obtained by a pulse generation circuit 23. The pulse signals l indicate the zero cross points of the delayed fundamental wave signal j, which is a condition essentially different from that of the present invention. Furthermore, by superposing the pulse signals l on the reproduced FM signal h by an adder 24, a signal m is obtained. Since a zero cross point exists at a point of a high modulation index, the inversion phenomenon does not occur.

However, the pulse signals l represent the time information of the zero cross points of the signal j of the fundamental wave which is delayed by the prescribed time, while the time information of the peak points of the input FM signal waveform is essentially different time information. Thus, the addition of signals having different time information causes the information of the FM signal to be distorted, so that the following problems are caused.

If it is assumed that an FM allocation of a VTR is 5 to 7 MHz, and the dark clip is 100, and the white clip is 200%, then the dark clip frequency becomes 3 MHz, and the white clip frequency becomes 9 MHz, and the range where the fundamental wave exists becomes 3 to 9 MHz. That is to say, the inversion period of the fundamental wave will change between a range of approximately 333/2 nsec and 111/2 nsec.

When the fundamental wave signal i is delayed by 100 nsec to form the signal j, the pulse-superposed FM signal m indicates that the phase relationship between the superposed pulses and the FM signal changes with frequency. That is, when the frequency of the fundamental wave signal i is low, the pulses are superposed on positions close to the peak points of the fundamental wave signal, but when the frequency of the fundamental wave signal is high, the pulses are superposed on positions shifted from the peak points of the fundamental wave signal. Therefore, the zero cross point cannot be restored at a point $X_1$, so that what is called the black break is generated. At a point $X_2$ where an excess zero cross is generated, what is called the white break is generated.

When the delay time is reduced to 50 nsec, the signals j, k, l, and m become signals $j_2$, $k_2$, $l_2$, and $m_2$, respectively. The signal $m_2$ indicates that the white break is generated at the point $X_3$. When the delay time is further reduced, the pulse signals will be superposed closer to the zero cross area, so that the waveform at the zero cross points of the reproduced FM signal is changed. This will detrimentally influence the frequency characteristics after demodulation. Therefore, mere reduction of the delay time is not desirable.

As described above in the conventional frequency demodulator as disclosed in U.S. Pat. No. 4,470,080, the prevention of the invention phenomenon cannot be achieved over the overall frequency range of the FM signal. Furthermore, the superposed pulses cause deterioration of the FM signal waveform.

SUMMARY OF THE INVENTION

An object of the present invention is to provide a frequency demodulation circuit which performs accurate frequency demodulation without causing the inversion phenomena.

Another object of the present invention is to provide a frequency demodulation circuit which performs accurate frequency demodulation with a high signal to noise ratio (S/N).

To achieve these objects, according to the present invention, a pulse having a small width is superposed on an input frequency-modulated (FM) signal substantially at each peak thereof irrespective of frequency before the FM signal is fed to a conventional frequency demodulator. A pulse of positive polarity is superposed substantially at each positive peak of the FM signal, and a pulse of negative polarity is superposed substantially at each negative peak of the FM signal. The pulses are superposed so that all of the zero cross points of the FM signal are correctly reproduced in the frequency demodulator. The pulse width is preferably at most a half of a period of the FM signal at the maximum frequency thereof.

A frequency demodulation circuit embodying the present invention comprises a peak detection circuit which detects peaks of an input FM signal, a pulse generating circuit which generates pulses occurring at timings at which the peaks present according to the detection result by the peak detection circuit, an adder which adds the input FM signal and the pulses generated by the pulse generating circuit to obtain a FM signal on which the pulses are superposed at the peaks thereof, and a frequency demodulator for demodulating the pulse-superposed FM signal.

Preferably, the peak detection circuit is replaced by a fundamental wave peak detection circuit which detects peaks of the fundamental wave of the input FM signal. Since the peaks of the fundamental wave are regarded substantially identical to the peaks of the FM signal, a FM signal on which the pulses are superposed substantially at the peaks thereof can be obtained as the output of the adder. In this case, the fundamental wave peak detection circuit has a band-pass filter for extracting the fundamental wave component from the input FM signal. The band-pass filter reduces noise.

The input FM signal may be passed, before being fed to the adder, through an equalizer for compensating for a signal delay caused in the peak detection and pulse generating circuits. The equalizer may have a low-pass filter characteristic to eliminate low S/N high band components of the FM signal.

A level adjusting circuit for adjusting the level of the pulses generated by the pulse generating circuit and a control circuit for controlling the level adjusting circuit according to a desired signal may be added to the frequency demodulation circuit for providing a further enhanced function.

The above and other objects, features and advantages of the present invention will be apparent from the following description of the preferred embodiments taken in connection with the accompanying drawings in which:

BRIEF DESCRIPTION OF THE DRAWINGS

FIG. 10 is a block diagram of a third embodiment of the present invention;

FIG. 11 consisting of a, b, c, d, $d_1$ and c is a waveform diagram of the third embodiment of the present invention;

FIG. 12 is a circuit diagram of the level adjustment circuit;

DESCRIPTION OF THE PREFERRED EMBODIMENTS

Figure 1:
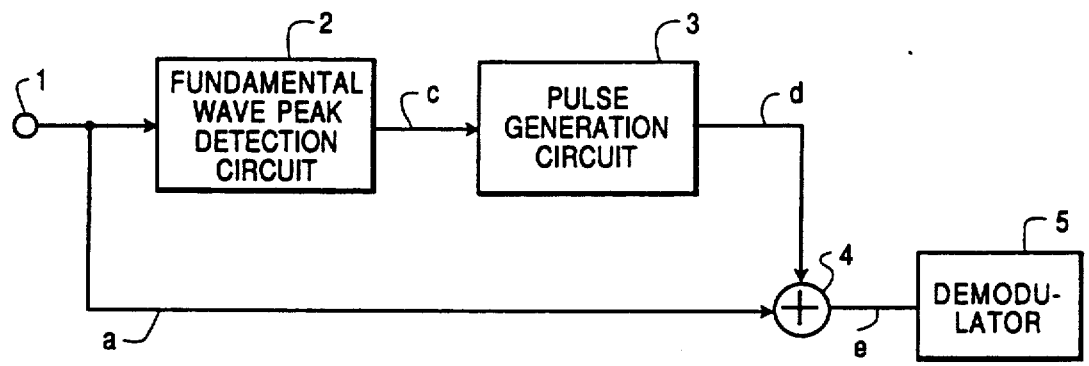
FIG. 1 is a block diagram of a first embodiment of the present invention.
Figure 2:
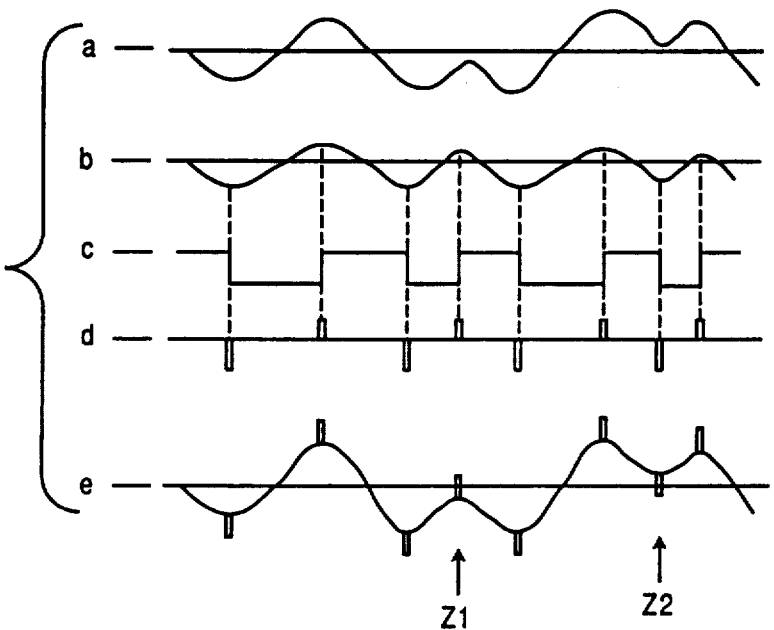
FIG. 2 consisting of a through e is a waveform diagram of the first embodiment of the present invention.

FIG. 1 shows a block diagram of a first embodiment of the present invention, and FIG. 2 shows waveform diagrams at corresponding portions a through e in the same diagram. A FM signal a inputted from a terminal 1 is fed into a fundamental wave peak detection circuit 2. The fundamental wave peak detection circuit 2 outputs a rectangular signal c whose transition edges indicate the peak points of the fundamental wave component b of the FM signal a. A pulse generation circuit 3 generates, from the signal c, pulses d of positive polarity at the rising edges of the signal c and of negative polarity at the falling edges of the signal c. The pulse generation circuit 3 may be a differentiation circuit. The FM signal a and the pulses d are added by an adder 4 to obtain a signal e. Since the pulse generation points of the pulses d agree perfectly with the peak points of the signal b, the pulses d will always be superposed on the peak points of the FM signal a to form the signal e.

The signal e restores the zero cross point in the section between Z1 and Z2 where the inversion phenomenon was generated conventionally, so that the inversion phenomenon does not occur when the signal e is demodulated by a demodulator 5 of the conventional pulse counter type, thereby realizing an accurate frequency demodulation.

Figure 3:
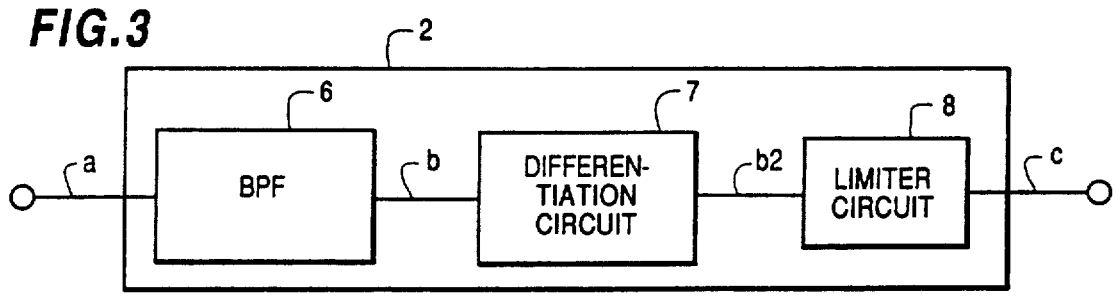
FIG. 3 is a block diagram of a fundamental wave peak detection circuit in the first embodiment of the present invention.
Figure 4:
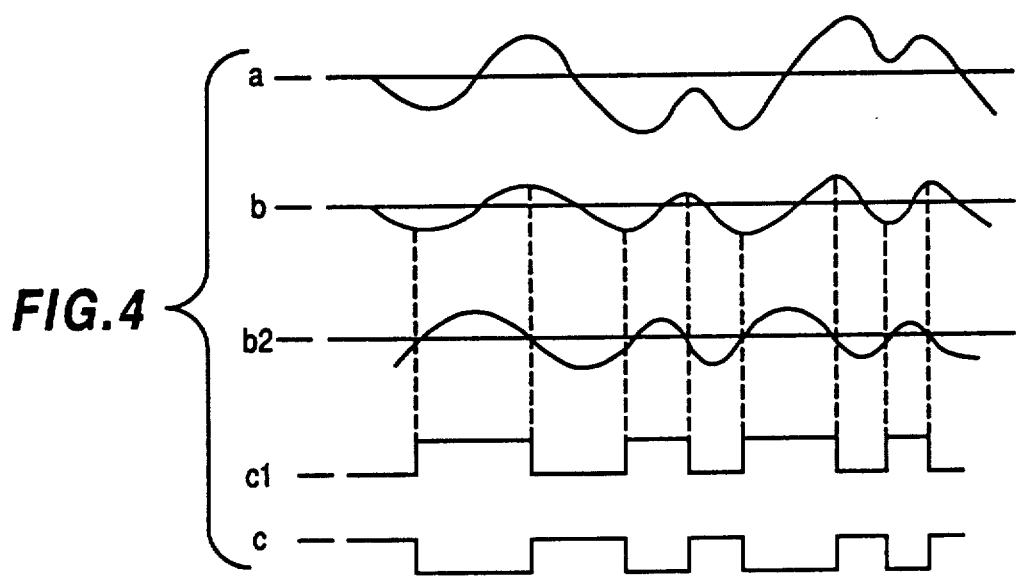
FIG. 4 consisting of a, b, $b_2$, C, and $c_2$ is a waveform diagram of the fundamental wave peak detection circuit in the first embodiment of the present invention.

FIG. 3 shows a first example of the fundamental wave peak detection circuit 2, which detects the peak points of the fundamental wave, and FIG. 4 shows waveforms in the circuit of FIG. 3. The input FM signal a is passed through a band-pass filter (BPF) 6 so as to extract the FM fundamental wave b. Here, the pass band of the BPF is roughly set to cover the deviation of the FM signal. Then, in order to detect the peak points of the signal b, the signal b is differentiated by a differentiation circuit 7 to obtain a signal b2. Here, the zero cross points of the signal b2 indicate the peak points of the signal b. In a limiter circuit 8, a signal c1 can be obtained by limiting the signal b2 and the signal c can be obtained by inverting the signal c1. The polarity in the limiter circuit 8 is adjusted to be the same in phase as the FM signal.

Figure 5A:
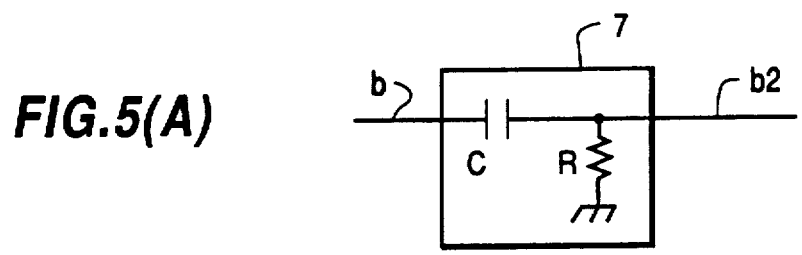
FIGS. 5 (A) and (B) are circuit diagrams of a differentiation circuit in the fundamental wave peak detection circuit.
Figure 5B:
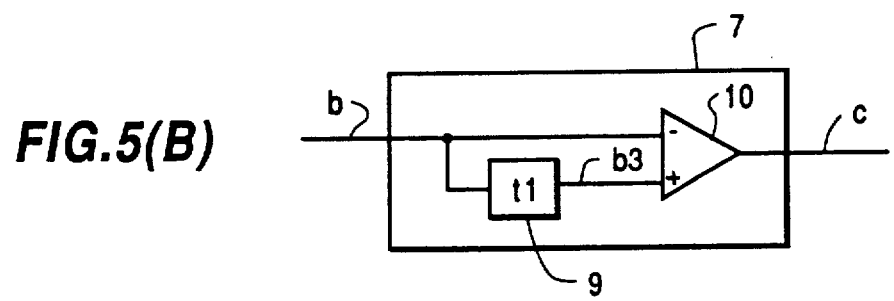

FIG. 5 (A) shows an example of the differentiation circuit 7. The differentiation circuit in FIG. 5 (A) comprises a resistor R and a capacitor C. In this arrangement, the order of the BPF 6 and the differentiation circuit 7 may be reversed.

Figure 6:
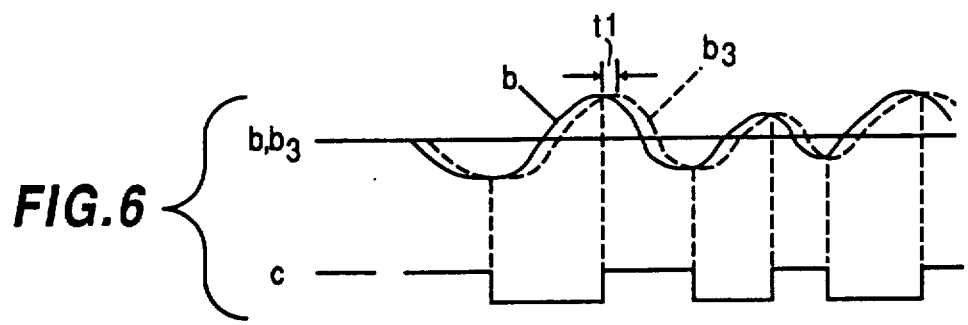
FIG. 6 consisting of b, $b_3$ and c is a waveform diagram of the differentiation circuit of FIG. 5 (B)

Another example of the differentiation circuit 7 is shown in FIG. 5 (B), in which the differentiation circuit comprises a delay circuit 9, which delays the signal b by a minute time $t_1$ to obtain a signal b3, and a comparator 10. The operation of the circuit in FIG. 5 (B) will be described by using waveform diagrams shown in FIG. 6. The FM fundamental wave b and the signal b3 which is delayed from the signal b by $t_1$ are compared by the comparator 10 to obtain the signal c. In this case, the transition edges of the signal c are shifted from the peak points of the signal b by the minute time $t_1$, but the shift amount is practically ignorable because the time $t_1$ is minute (for example, the time $t_1$ is 20 nsec). If this arrangement is used in the differentiation circuit 7, there is an advantage in that the limiter circuit 8 in FIG. 3 can be omitted.

Figure 7:
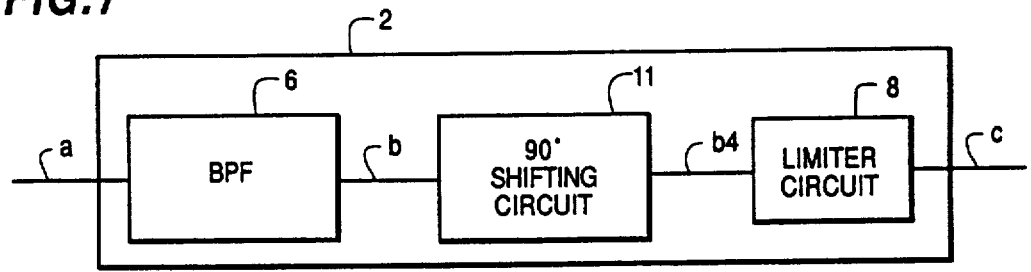
FIG. 7 is a block diagram of another fundamental wave peak detection circuit of the present invention.
Figure 9:
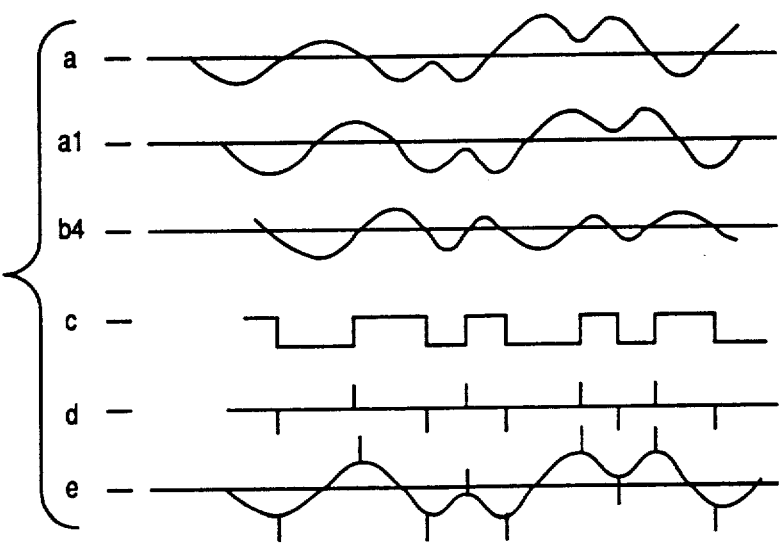
FIG. 9 consisting of a, a, $b_4$, c, d and e is a waveform diagram of the circuit in FIG. 7 and the second embodiment of the present invention in FIG. 8.
Figure 13A:
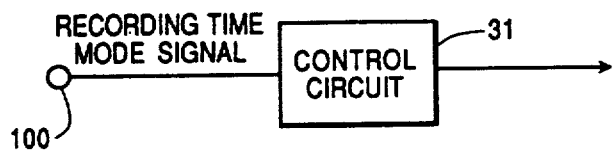
FIG. 13 (A)-(E) are block diagrams of a control circuit and FIG. 13 (F) is a waveform diagram of a 100% white signal.
Figure 13B:
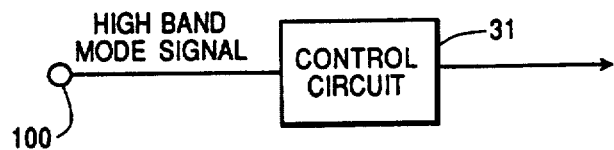
Figure 13C:
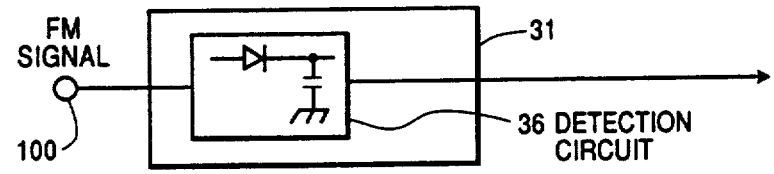
Figure 13D:
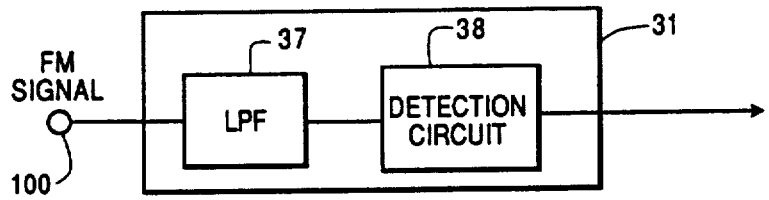
Figure 13E:
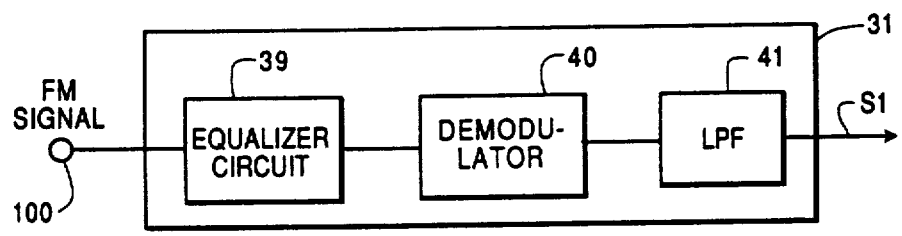
Figure 13F:
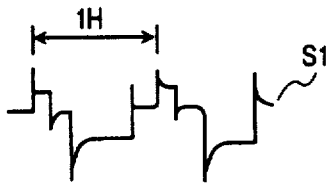

A second example of the fundamental wave peak detection circuit 2 shown in FIG. 7 will be described with reference to waveform diagrams shown in FIG. 9. The FM fundamental wave b is output from the FM signal a by the BPF 6. In a 90° shifting circuit 11, the phase of the signal b is shifted by 90° in a band where the fundamental wave b exists. As a result of this, a signal b4 can be obtained. The zero cross points of the signal b4 are in agreement with the peak points of the signal b. In other words, by limiting the signal b4 by the limiter circuit 8, it is possible to obtain the signal c. Here, the 90° shifting circuit 11 can be composed of a capacitor and a resistor.

Figure 8:
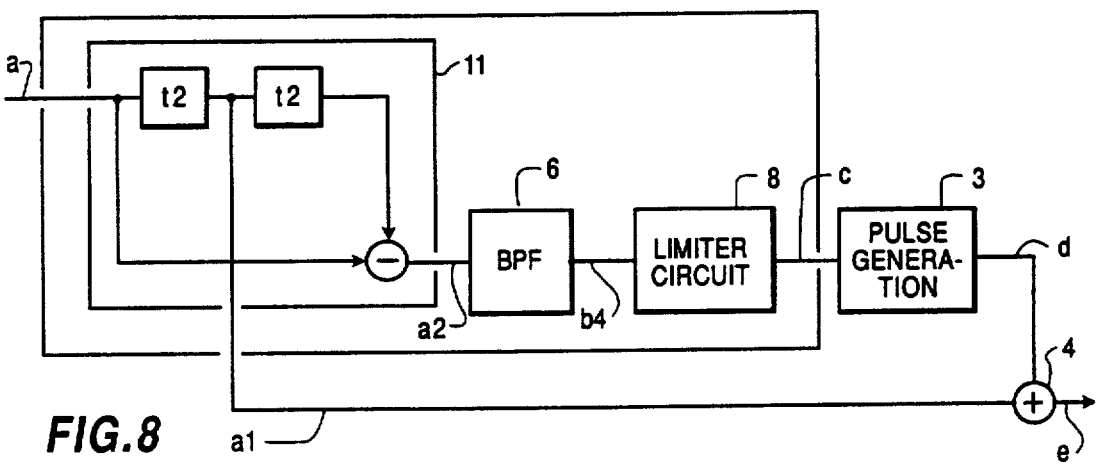
FIG. 8 is block diagram of a second embodiment of the present invention.

It is also possible to compose the 90° shifting circuit with a delay element as shown in FIG. 8 which is a second embodiment of the present invention. The 90° shifting circuit 11 shown in FIG. 8 is a kind of a comb line filter, in which the phase difference between a signal a1 which is delayed by a time $t_2$ and a signal a2 which is produced by synthesizing the input FM signal a and a signal delayed from the signal a by a time $2t_2$ is always 90°. The signal a1 is fed to the adder 4. The signal a2 is fed to the BPF 6 to obtain the fundamental wave b4. The zero cross points of the fundamental wave b4 are in agreement with the peak points of the signal a1. Thus, by limiting the signal b4 by the limiter circuit 8, it is possible to obtain the signal c. In the arrangement shown in FIG. 8, because the input FM signal is also delayed by $t_2$, the arrangement thereof is somewhat different from the block diagram shown in FIG. 1. This difference resulted from the arrangement of the 90° shifting circuit is not an essential difference.

FIG. 10 shows a block diagram of a third embodiment of the present invention, and FIG. 11 shows waveform diagrams at the corresponding portions a through e in the FIG. 10 block diagram. A FM signal a inputted from a terminal 1 is fed into a fundamental wave peak detection circuit 2. The fundamental wave peak detection circuit 2 outputs a rectangular signal c whose transition edges indicate the peak points of the fundamental wave component b of the FM signal. A pulse generation circuit 3 generates, from the signal c, pulses d of positive polarity at the rising edges of the signal c and of negative polarity at the falling edges of the signal c. The pulse generation circuit 3 may be a differentiation circuit. The pulses d are adjusted in level by a level adjustment circuit 30 to be d1 and sent to an adder 4. The level adjustment circuit 30 is controlled by a control circuit 31. The control circuit 31 and a signal inputted thereto through a terminal 100 will be described later.

The FM signal a and the pulses $d_1$ are added by the adder 4 to obtain a signal e. Because the pulse generation points of the pulses $d_1$ agree perfectly with the peak points of the signal b, the pulses $d_1$ will always be superposed on the peak points of the FM signal a to be the signal e.

The signal e restores the zero cross points in the section between $Z_1$ and $Z_2$ where the inversion phenomenon was generated conventionally, so that the inversion phenomenon does not occur when the signal e is demodulated in a demodulator 5 of the conventional pulse counter type, thereby realizing an accurate frequency demodulation.

An example of the level adjustment circuit 30 is shown in FIG. 12, in which the level adjustment circuit comprises resistors R1, R2, and a FET 32. The output signal of the pulse generation circuit 3 is inputted through a terminal 34, and a small level is outputted from a terminal 35 when the signal from the control circuit 31 inputted through a terminal 33 is high, while a large level is outputted from the terminal 35 when the signal from the control circuit 31 is low.

Now, examples of the control circuit 31 are shown in FIGS. 13 (A) through (E).

The control circuit shown in FIG. 13 (A) uses the recording time mode signal set in a recording and reproducing apparatus as the input signal, and outputs a low signal in the long time recording mode, thereby controlling the level adjustment circuit so as to increase the addition level.

The control circuit shown in FIG. 13 (B) uses, as the input signal, the high band recording mode signal which indicates the normal FM carrier frequency which is set in a recording and reproducing apparatus or the high band FM carrier frequency which is shifted to the high band, and outputs a low signal in the high band mode, thereby controlling the level adjustment circuit so as to increase the addition level.

The control circuit shown in FIG. 13 (C) is composed of a detection circuit 36 which detects the amplitude level of the FM signal, and outputs a low signal when the amplitude level of the FM signal is small, thereby controlling the level adjustment circuit so as to increase the addition level.

The control circuit shown in FIG. 13 (D) is compose of a low pass filter 37 which passes the lower side-band of the FM signal and a detection circuit 38 which detects the lower side-band level, and outputs a low signal when the lower side-band level is large, thereby controlling the level adjustment circuit so as to increase the addition level.

The control circuit shown in FIG. 13 (E) is composed of an equalizer circuit 39 which emphasizes only the fundamental wave component of the FM signal, a demodulator 40 which demodulates the output of the equalizer circuit 39, and a low pass filter 41 which passes the low band component of the output of the demodulator, thereby controlling the output S1 so as to increase the addition level when the output signal level of the low pass filter approaches a level indicating that the FM signal is in high band. The equalizer is inserted to prevent the inversion phenomenon from generating in the demodulator. If the carrier frequency of the white level of a video signal is modulated higher than the carrier frequency of the black level of the video signal, the closer the image signal is to the white level of the signal demodulated in the demodulator, then the lower is the output S1 of the control circuit 31. A signal waveform which is not provided with deemphasis is desirable. FIG. 13 (F) shows a waveform when the video signal is 100% white.

In the embodiments described above, the BPF 6, which is an element of the fundamental wave peak detection circuit 2, is effective to improve S/N (or O/N in a recording and reproducing apparatus). The S/N improvement effect is enhanced by narrowering the pass band of the BPF 6. However, if the band is made too narrow to pass the FM fundamental wave, the detection of the peaks of the fundamental wave becomes incomplete. Therefore, according to the carrier frequency of the FM signal and conditions of S/N, it is preferable to employ an adaptive control so that the band width of the BPF becomes optimum. The information to be used for the adaptive control may be the output level of the FM signal, the recording mode of a recording and reproducing apparatus (in a VTR for example, a standard recording, a long time recording or a standard recording, high band recording), or the like.

Figure 14:
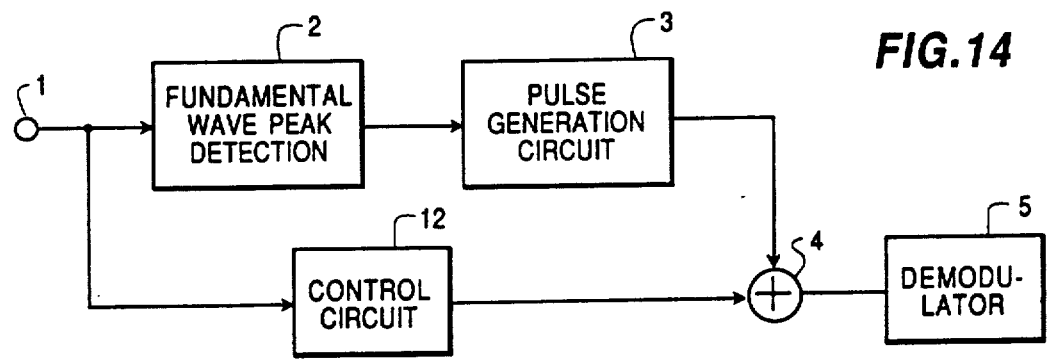
FIGS. 14 and 15 are block diagrams of other embodiments of the present invention.
Figure 15:
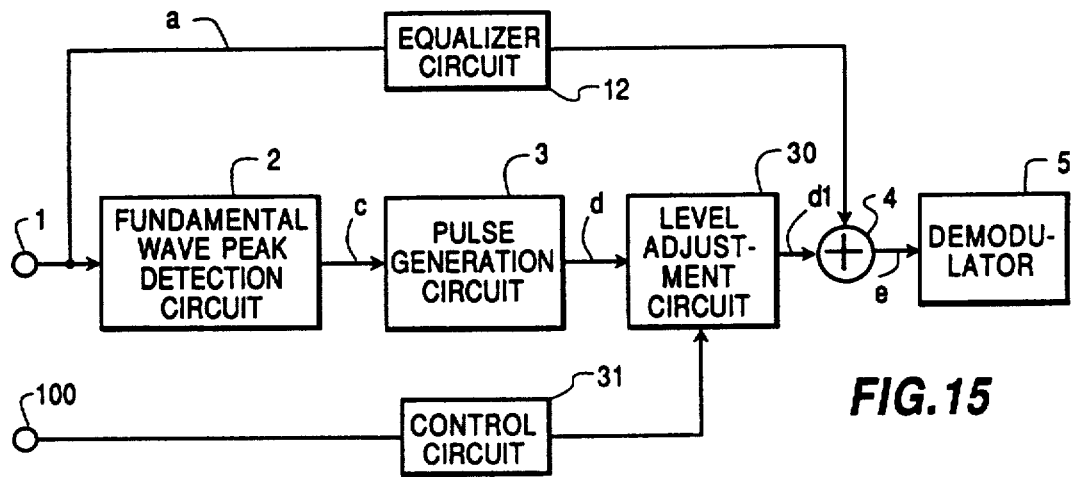
Figure 16:
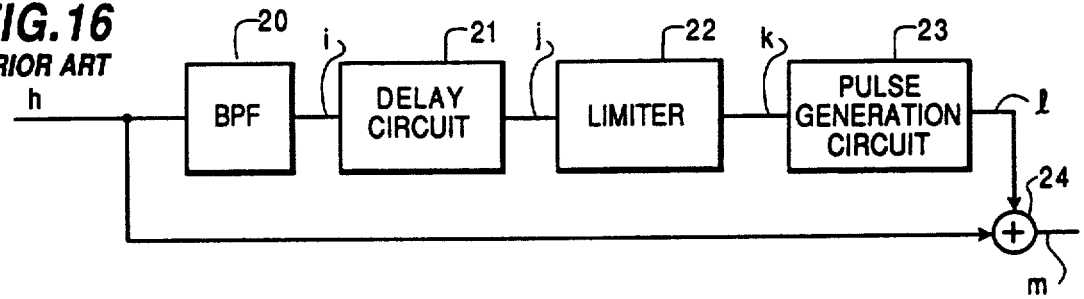
FIG. 16 is a block diagram of a conventional example.
Figure 17:
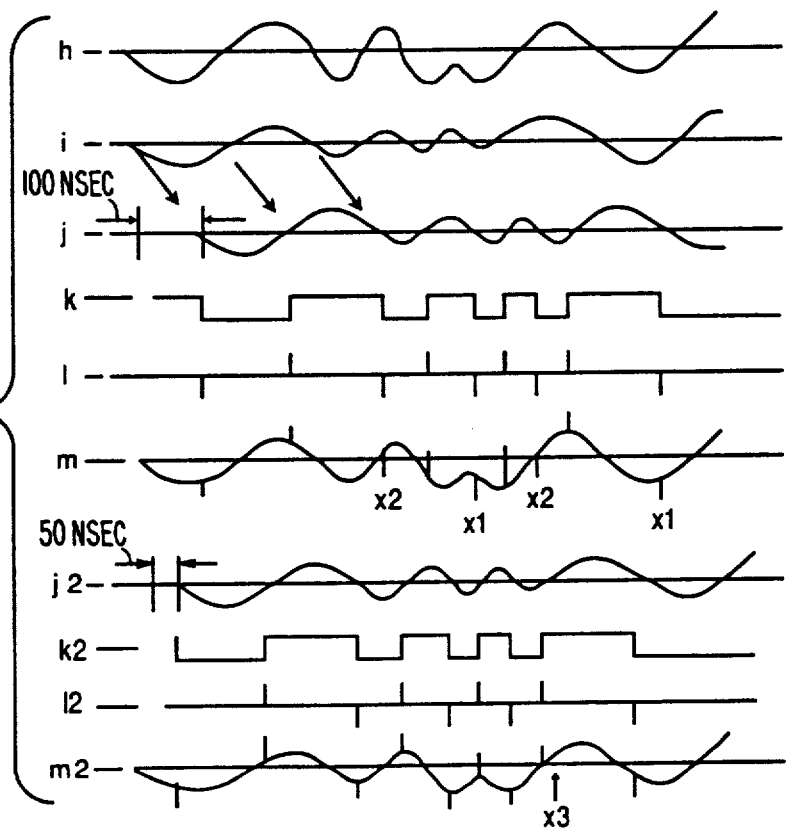
FIG. 17 consisting of h, i, j, k, l, m, $j_2$, $K_2$, $l_2$ and $m_2$ is a waveform diagram of the conventional example.

Further, a minute delay would be caused due to the operation of the circuits or the filter in the fundamental wave peak detection circuit 2 and the pulse generation circuit 3. Therefore, as shown in FIGS. 14 and 15, to compensate for such a minute delay, it is preferable to insert an equalizer circuit 12 in the direct FM signal path from the terminal 1 to the adder 4. It is desirable for the equalizer circuit 12 that the group delay frequency characteristic is constant and the frequency characteristic is flat. However, from the aspect of S/N improvement, the equalizer circuit 12 may have a low pass filter characteristic which attenuates the high band component, having poor S/N, of the FM signal.

Conventionally, an improvement of the S/N by the attenuation of high band component of the FM signal in a stage before the demodulator 5 has been known, but the attenuation amount could not be made adequately large because the inversion phenomenon often took place when the attenuation amount was large. However, according to the present invention, it is possible not to cause the inversion phenomenon to be generated while the attenuation amount of the high band of the equalizer 12 is made large enough to effectively improve S/N. That is to say, the present invention has an advantage of the S/N improvement as a secondary effect.

Furthermore, in the first embodiment of the detection circuit 2, it is also possible to widen the band width of the BPF 6 so as to pass the FM side band wave or to remove the BPF 6 so as to directly detect the peak points of the FM signal having the side band wave by the differentiation circuit 7. In this case however, because there is no band restriction, there is no effect of the S/N improvement, so that the reliability of the output signal c of the limiter circuit 8 becomes lower than that of the embodiments described above. To enhance the S/N improvement effect, it is desirable that the band of the BPF 6 is as narrow as possible while containing a high band of deviation from the carrier center of the FM signal.

Incidently, from another point of view, the pulses d which are to be superposed on the FM signal is a higher harmonic signal containing odd harmonic components of the fundamental wave of the FM signal higher than a specific order. Therefore, the circuit constituted by the fundamental wave peak detection circuit 2 and the pulse generation circuit 3 can be called a higher harmonic signal generating circuit.

The frequency demodulation circuit of the present invention as described hereinabove with reference to some preferred embodiments can be used in a variety of systems which employ frequency modulation, including audio and/or video signal recording and reproducing systems which record audio an /or video signals in the form of frequency-modulated signals on a recording medium and reproduce the recorded signal.

Although some preferred embodiments have been described, they have been shown for the aid of better understanding of the invention. It should be understood that various changes and modification may be made within the scope of the invention solely defined in the appended claims.

What is claimed is:

1. A frequency demodulation circuit comprising:
    a fundamental wave peak detection circuit for detecting peaks of a fundamental wave of an input frequency-modulated signal;
    a pulse generating circuit for generating, according to the detection result by the peak detection circuit, pulses respectively occurring at timings at which the peaks present, polarities of the pulses being equal to polarities of the respective corresponding peaks;
    a level adjusting circuit for adjusting the level of the pulses generated by the pulse generating circuit;
    a control circuit for controlling the level adjusting circuit according to a predetermined signal;
    an adder for adding the level adjusted pulses outputted from the level adjusting circuit to the input frequency-modulated signal to obtain a frequency-modulated signal on which the level adjusted pulses are respectively superposed substantially at peaks thereof; and
    a frequency demodulator for demodulating the frequency-modulated signal outputted from the adder.

2. A frequency demodulation circuit as claimed in claim 1, further comprising an equalizer for delaying the input frequency-modulated signal before being fed to the adder so as to compensate for a signal delay caused in the peak detection circuit, the pulse generating circuit and the level adjusting circuit.

3. A frequency demodulation circuit as claimed in claim 2, wherein the equalizer has a low-pass filter characteristic so as to eliminate high frequency band components of the input frequency-modulated signal having low signal to noise ratio.

4. A frequency demodulation circuit as claimed in claim 1, wherein the fundamental wave peak detection circuit produces from the input frequency-modulated signal a rectangular waveform signal whose level transition timings correspond to the peaks of the fundamental wave, and the pulse generating circuit generates the pulses respectively at the level transition timings of the rectangular waveform signal.

5. A frequency demodulation circuit as claimed in claim 4, wherein the pulse generating circuit comprises a differentiation circuit which differentiates the rectangular waveform signal.

6. A frequency demodulation circuit as claimed in claim 4, wherein the fundamental wave peak detection circuit comprises:
    a band-pass filter for extracting the fundamental wave from the input frequency-modulated signal;
    a differentiation circuit for differentiating the fundamental wave to obtain a signal whose zero cross points correspond to the peaks of the fundamental wave; and
    a limiter for limiting the level of the signal outputted from the differentiation circuit thereby to obtain the rectangular waveform signal.

7. A frequency demodulation circuit as claimed in claim 4, wherein the fundamental wave peak detection circuit comprises:
    a band-pass filter for extracting the fundamental wave from the input frequency-modulated signal;
    a delay circuit for delaying the fundamental wave by a minute time to obtain a minutely delayed fundamental wave; and
    a comparator for comparing levels of the fundamental wave and the minutely delayed fundamental wave thereby to obtain a signal substantially the same as the rectangular waveform signal.

8. A frequency demodulation circuit as claimed in claim 4, wherein the fundamental wave peak detection circuit comprises:
    a band-pass filter for extracting the fundamental wave from the input frequency-modulated signal;
    a phase shifting circuit for shifting the phase of the fundamental wave by 90° to obtain a 90° phase shifted fundamental wave whose zero cross points correspond to the peaks of the fundamental wave; and a limiter for limiting the level of the 90° phase shifted fundamental wave thereby to obtain the rectangular waveform signal.

9. A frequency demodulation circuit as claimed in claim 1, wherein the control circuit comprises a detection circuit which receives the input frequency-modulated signal as the predetermined signal for detecting an amplitude level of the input frequency-modulated signal, and the level adjusting circuit is responsive to the detected amplitude level for increasing the level of the pulses outputted from the pulse generating circuit as the detected amplitude level decreases.

10. A frequency demodulation circuit as claimed in claim 1, wherein the control circuit receives the input frequency-modulated signal as the predetermined signal and comprises: a low-pass filter for extracting a lower side band signal from the input frequency-modulated signal; and a detection circuit for detecting an amplitude level of the lower side band signal, and wherein the level adjusting circuit is responsive to the detected amplitude level for increasing the level of the pulses outputted from the pulse generating circuit as the detected amplitude level increases.

11. A frequency demodulation circuit as claimed in claim 1, wherein the control circuit receives the input frequency-modulated signal as the predetermined signal and comprises: an equalizer for emphasizing only the fundamental wave of the input frequency-modulated signal; a demodulator for demodulating an output signal from the equalizer; and a low-pass filter for passing a low frequency component of an output signal from the demodulator, and wherein the level adjusting circuit is responsive to an output signal from the low-pass filter for increasing the level of the pulses outputted from the pulse generating circuit as the level of the output signal from the low-pass filter varies in a direction indicating that the frequency of the fundamental wave is in a high band.

12. A frequency demodulation circuit as claimed in claim 1 used in a signal recording and reproducing apparatus, wherein the control circuit receives as the predetermined signal a signal indicating a recording time mode of the apparatus, and controls the level adjusting circuit so as to increase the level of the pulses outputted from the pulse generating circuit when the recording time mode is a long recording time mode.

13. A frequency demodulation circuit as claimed in claim 1 used in a signal recording and reproducing apparatus, wherein the control circuit receives as the predetermined signal a high band recording mode signal indicating whether the carrier frequency of the frequency-modulated signal is a normal frequency set for the apparatus or a higher frequency than the normal frequency, and controls the level adjusting circuit so as to increase the level of the pulses outputted from the pulse generating circuit when the carrier frequency is the higher frequency.

14. A frequency demodulation circuit comprising:
a peak detection circuit for detecting peaks of an input frequency-modulated signal, comprising:
a differentiation circuit for differentiating the input frequency-modulated signal to obtain a signal whose zero cross points correspond to the peaks of the input frequency-modulated signal; and
a limiter for limiting the level of the signal outputted from the differentiation circuit to obtain a rectangular waveform signal whose level transition timings correspond to the peaks of the input frequency-modulated signal;

a pulse generating circuit for generating from the rectangular waveform signal pulses respectively occurring at timings at which the peaks of the input frequency-modulated signal present, polarities of the pulses being equal to polarities of the respective corresponding peaks;

an adder for adding the pulses to the input frequency-modulated signal to obtain a frequency-modulated signal on which the pulses are respectively superposed at the peaks thereof; and a frequency demodulator for demodulating the frequency-modulated signal outputted from the adder.

15. A frequency demodulation circuit comprising:
a peak detection circuit for detecting peaks of an input frequency-modulated signal, comprising:
a delay circuit for delaying the input frequency-modulated signal by a minute time to obtain a minutely delayed frequency-modulated signal; and
a comparator for comparing levels of the input frequency-modulated signal and the minutely delayed frequency-modulated signal to obtain a rectangular waveform signal whose level transition timings correspond to the peaks of the input frequency-modulated signal;

a pulse generating circuit for generating from the rectangular waveform signal pulses respectively occurring at timings at which the peaks of the input frequency-modulated signal present, polarities of the pulses being equal to polarities of the respective corresponding peaks;

an adder for adding the pulses to the input frequency-modulated signal to obtain a frequency-modulated signal on which the pulses are respectively superposed at the peaks thereof; and a frequency demodulator for demodulating the frequency-modulated signal outputted from the adder.

16. A frequency demodulation circuit comprising:
a fundamental wave peak detection circuit for detecting peaks of a fundamental wave of an input frequency-modulated signal, comprising:
a band-pass filter for extracting the fundamental wave from the input frequency-modulated signal;
a differentiation circuit for differentiating the fundamental wave to obtain a signal whose zero cross points correspond to the peaks of the fundamental wave; and
a limiter for limiting the level of the signal outputted from the differentiation circuit to obtain a rectangular waveform signal whose level transition timings correspond to the peaks of the fundamental wave;

a pulse generating circuit for generating from the rectangular waveform signal pulses respectively occurring at timings at which the peaks of the fundamental wave present, polarities of the pulses being equal to polarities of the respective corresponding peaks;

an adder for adding the pulses to the input frequency-modulated signal to obtain a frequency-modulated signal on which the pulses are respectively superposed substantially at peaks thereof; and a frequency demodulator for demodulating the frequency-modulated signal outputted from the adder.

17. A frequency demodulation circuit comprising:

a fundamental wave peak detection circuit for detecting peaks of a fundamental wave of an input frequency-modulated signal, comprising:

- a band-pass filter for extracting the fundamental wave from the input frequency-modulated signal;
- a delay circuit for delaying the fundamental wave by a minute time to obtain minutely delayed fundamental wave; and
- a comparator for comparing levels of the fundamental wave and the minutely delayed fundamental wave to obtain a rectangular waveform signal whose level transition timings correspond to the peaks of the fundamental wave;

a pulse generating circuit for generating from the rectangular waveform signal pulses respectively occurring at timings at which the peaks of the fundamental wave present, polarities of the pulses being equal to polarities of the respective corresponding peaks;

an adder for adding the pulses to the input frequency-modulated signal to obtain a frequency-modulated signal on which the pulses are respectively superposed substantially at peaks thereof; and a frequency demodulator for demodulating the frequency-modulated signal outputted from the adder.

* * * * *